United States Patent
Suhr et al.

(10) Patent No.: US 9,368,397 B2
(45) Date of Patent: Jun. 14, 2016

(54) METHOD FOR FORMING A VERTICAL ELECTRICAL CONNECTION IN A LAYERED SEMICONDUCTOR STRUCTURE

(75) Inventors: Dominique Suhr, Chatenay Malabry (FR); Vincent Mevellec, Chaville (FR)

(73) Assignee: ALCHIMER, Massy (FR)

( * ) Notice: Subject to any disclaimer, the term of this patent is extended or adjusted under 35 U.S.C. 154(b) by 139 days.

(21) Appl. No.: 14/119,184

(22) PCT Filed: May 22, 2012

(86) PCT No.: PCT/EP2012/059503
§ 371 (c)(1),
(2), (4) Date: Nov. 20, 2013

(87) PCT Pub. No.: WO2012/160063
PCT Pub. Date: Nov. 29, 2012

(65) Prior Publication Data
US 2014/0084474 A1    Mar. 27, 2014

Related U.S. Application Data

(60) Provisional application No. 61/489,015, filed on May 23, 2011.

(30) Foreign Application Priority Data

May 23, 2011   (EP) .................................. 11305632

(51) Int. Cl.
*H01L 21/4763* (2006.01)
*H01L 21/44* (2006.01)
(Continued)

(52) U.S. Cl.
CPC .... *H01L 21/76816* (2013.01); *H01L 21/02063* (2013.01); *H01L 21/288* (2013.01);
(Continued)

(58) Field of Classification Search
CPC ..... A61L 31/10; C08F 283/00; C08F 291/00;
C08F 292/00; C08L 51/003; C08L 51/10;
C08L 2666/02; C09D 5/4476; C25D 7/00;
H01C 17/06586; H01G 4/14; H01G 9/0036;
H01L 51/0006; H01L 51/0034
USPC .................................................. 438/613, 637
See application file for complete search history.

(56) References Cited

U.S. PATENT DOCUMENTS 3,642,549 A     2/1972  Couture et al.
4,442,421 A  *  4/1984  Jacobus et al. .................. 338/35
(Continued)

FOREIGN PATENT DOCUMENTS

FR    2 950 634 A1    4/2011
FR    2 961 220 A1    12/2011
(Continued)

*Primary Examiner* — Marc Armand
*Assistant Examiner* — Wilner Jean Baptiste
(74) *Attorney, Agent, or Firm* — Blakely Sokoloff Taylor & Zafman LLP

(57) ABSTRACT

The invention proposes a method for forming a vertical electrical connection (50) in a layered semiconductor structure (1), comprising the following steps: —providing (100) a layered semiconductor structure (1), said layered semiconductor structure (1) comprising: —a support substrate (20) including an first surface (22) and a second surface (24), —an insulating layer (30) overlying the first surface (22) of the support substrate (20), and —at least one device structure (40) formed in the insulating layer (30); and —drilling (300) a via (50) from the second surface of the support substrate (20) up to the device structure (40), in order to expose the device structure (40); characterized in that drilling (300) of the insulating layer is at least performed by wet etching (320).

21 Claims, 4 Drawing Sheets

(51) Int. Cl.
*H01L 21/768* (2006.01)
*H01L 21/02* (2006.01)
*H01L 21/288* (2006.01)
*H01L 21/311* (2006.01)
*H01L 23/48* (2006.01)
*H01L 23/522* (2006.01)
*H01L 23/528* (2006.01)
*H01L 23/532* (2006.01)

(52) U.S. Cl.
CPC ...... *H01L21/2885* (2013.01); *H01L 21/31111* (2013.01); *H01L 21/76823* (2013.01); *H01L 21/76831* (2013.01); *H01L 21/76874* (2013.01); *H01L 21/76879* (2013.01); *H01L 21/76898* (2013.01); *H01L 23/481* (2013.01); *H01L 23/5226* (2013.01); *H01L 23/5283* (2013.01); *H01L 23/53238* (2013.01); *H01L 2924/0002* (2013.01); *H01L 2924/12044* (2013.01)

(56) References Cited

U.S. PATENT DOCUMENTS

| | | | |
|---|---|---|---|
| 7,598,167 B2 * | 10/2009 | Watkins et al. | 438/622 |
| 2006/0165909 A1 * | 7/2006 | Schreier et al. | 427/430.1 |
| 2010/0203726 A1 | 8/2010 | Cramer | |
| 2010/0225004 A1 | 9/2010 | Igarashi | |
| 2012/0000785 A1 * | 1/2012 | Zahraoui | C25D 17/001 205/91 |

FOREIGN PATENT DOCUMENTS

| | | |
|---|---|---|
| WO | WO 2009/115449 A1 | 9/2009 |
| WO | WO 2010/001054 A2 | 1/2010 |
| WO | WO 2010/044741 A1 | 4/2010 |
| WO | WO 2010/058503 A1 | 5/2010 |

* cited by examiner

METHOD FOR FORMING A VERTICAL ELECTRICAL CONNECTION IN A LAYERED SEMICONDUCTOR STRUCTURE

FIELD OF THE INVENTION

The present invention generally relates to a method for making a transverse electrical connection in a layered semiconductor structure.

More particularly, the invention concerns the manufacture of vias in an integrated circuit.

BACKGROUND OF THE INVENTION

The main application of the invention resides in the field of microelectronics, for the metallization, particularly with copper, of vias (called "through-silicon vias" (TSV) or "through-wafer vias" or "through-wafer interconnects"), the keystone for the three-dimensional (3D) integration, or vertical integration, of electronic chips (or dies). Such vias have typical hole size ranging between 0.5 µm and 500 µm, most commonly between 5 µm and 100 µm; and typical depth ranging between 10 µm and 750 m, most commonly between 50 µm and 300 µm. It also has applications in other fields of electronics where a substrate comprising vias must be electrically insulated and covered with a layer of copper. In this context can be mentioned the formation of interconnecting elements between printed circuit boards (or printed wire boards), of passive elements such as inductors, or of electromagnetic elements in integrated circuits or micro-electromechanical systems, or of metallization schemes for photovoltaic cells Current electronic systems mostly consist of several integrated circuits, or components, and each integrated circuit fulfils one or more functions. For example, a computer comprises at least one microprocessor and several memory circuits. Each integrated circuit usually corresponds to an electronic chip in its own package. The integrated circuits are soldered to or plugged into, for example, a printed circuit board (PCB) which ensures the connection between the integrated circuits.

The permanent need to increase the functional density of electronic systems has led, according to a first approach, to the so-called "system-on-chip" concept, with all the components and circuit units necessary to implement all the system functions being produced on the same chip without using a printed circuit support. In practice it is nonetheless very difficult to obtain a high-performance system-on-chip as the manufacturing methods for logic and memory circuits, for example, differ very substantially from each other. The system-on-chip approach therefore requires the acceptance of compromises with respect to the performance of various functions produced on the same chip. In addition, the size of such chips and their manufacturing efficiency are reaching the limits of their economic feasibility.

A second approach consists in forming in one and same package a module ensuring the interconnection of several integrated circuits, which may be formed on the same semiconductor substrate or on different substrates. The package thus obtained, or the multichip module (MOM) or System-in-Package (SiP) or System-On-a-Package (SOP), thus takes the form of a single component. This MOM approach makes it possible to obtain a higher interconnection density and therefore better performance than a conventional PCB approach. It is however not fundamentally distinguished from the PCB approach. Apart from the bulk and the weight of the package, the performance of an MOM remains limited by the electromagnetic interferences associated with the length of the connections from the substrate and with the wire bonds connecting the substrate or the chips to the pins of the package.

A third approach, called three-dimensional (3D) integration or vertical integration, is characterized by the fact that the chips are stacked and connected to each other by vertical interconnections drilled through the chip's material, electrically connecting the top surface with the bottom surface of the chip. The stack obtained thus comprises several layers or strata of active components or chips, and constitutes a 3D integrated circuit (or 3D IC).

The benefits of 3D integration are based on:

(1) improvement in performance, e.g. reduction in propagation time and in dissipated power, increase in the operating speed of the system associated with the accelerated communication between the functional units, increase in the bandwidth of each functional unit, increase in noise immunity;

(2) improved cost-effectiveness, e.g. increase in integration density, improved manufacturing efficiency due to the use of the electronic chip technology which is most appropriate for each functional unit, improved reliability; and (3) the possibility of producing highly integrated systems by stacking heterogeneous technologies (or co-integration), i.e. employing different materials and/or different functional components.

As a result, 3D integration today constitutes an essential alternative to the conventional approaches, which are reaching their limits in terms of performance, functional diversification and production costs. The foundations and advantages of 3D integration have been described, for example, in: A. W. Topol et al., "*Three-dimensional integrated circuits*" *IBM Journal Res. & Dev.*, no. 4/5 July/September 2006, 50, 491-506.

After stacking, for example by bonding, the chips may be individually connected to the pins of the package by wire bonding or flip-chip connections. The interconnections between the chips are generally carried out by employing TSVs.

The elementary technologies necessary for the production of 3D integrated circuits comprise in particular thinning the silicon wafers, aligning the layers, bonding the layers, and etching and metallizing the TSVs within each layer.

The thinning of silicon wafers may be carried out before forming the TSVs (e.g. U.S. Pat. No. 7,060,624, U.S. Pat. No. 7,148,565).

Alternatively, the etching and the metallization of vias may be carried out before thinning the silicon wafer (e.g. U.S. Pat. No. 7,060,624, U.S. Pat. No. 7,101,792). In this case, closed vias or blind vias are etched in the silicon on one side of the wafer to the desired depth, then metallised throughout before thinning the silicon wafer from the other side in order to expose the buried end of the metallization and thus obtain through-silicon vias.

The good electrical conductivity of copper and its high resistance to electro-migration, i.e. the low tendency of copper atoms to migrate under the effect of the electrical current density, which can be an important cause of failure, make it in particular a material of choice for the metallization of vias.

The vias of 3D integrated circuits are generally made in a manner similar to the "Damascene method" used in the field of microelectronics for forming elements for interconnecting integrated circuits, according to a series of steps comprising:

the etching of vias in or through the silicon wafer and through the Back-End-Of-Line (BEOL) stack if necessary (e.g. for via-last structures);

the deposition of an insulating dielectric layer, or liner;

the deposition of a barrier layer, serving to prevent the migration or diffusion of copper;

the optional deposition of a seed layer to improve the electro-deposition of copper in case the selected barrier material has a very low electrical conductivity the filling of the vias by electro-deposition of copper; and the elimination of excess copper and barrier from the wafer surface by chemical-mechanical polishing.

As mentioned above, the invention is more particularly directed to the fabrication of "via-last structures", i.e. TSVs formed in the integrated circuit, following the BEOL steps, by opposition with "via first" (which are formed prior to the front-end-of-line (FEOL) steps) and "via middle" (which are formed following FEOL steps but prior to the BEOL steps).

The "via first" method involves forming the TSVs in a substrate before any other fabrication of circuitry occurs. A pattern of vias is etched or drilled into a fraction of the depth of the base substrate. The vias are then filled with an insulating layer and conducting material and circuit manufacturing follows. One or more dies can then bond to the TSVs. The back side of the substrate containing the TSVs is ground down to expose the TSVs. Metallization of the exposed TSVs enables packaging of the multi-tiered structure.

In the "via last" method, circuit manufacturing and optional wafer thinning take place before the TSVs are formed. The circuitry contains interconnect conductive pads that will be coupling points for the TSVs. TSVs are created by either etching or drilling to the conductive pad through the depth of the substrate or etching or drilling from the back side of the substrate to the conductive pad. The TSV is then filled with an insulating layer and conducting material. The back of the substrate is metalized to enable packaging of the multi-tiered structure.

The distinction between the different kinds of TSVs being well-known by the skilled person, it will not be further discussed here. Nevertheless, one can refer to "Handbook of 3D Integration: Technology and Applications of 3D Integrated Circuits", Ph. Garrou et al., WILEY-VCH, 2009 in order to have additional information.

Usually, via-last TSVs are formed in accordance with the following steps:

providing a layered semiconductor structure, said layered semiconductor structure comprising:

a support substrate including a first surface and a back surface, at least one insulating layer overlying the first surface of the support substrate; most commonly a stack of insulating layers from different materials is used; and at least one conductive pad formed within the insulating layer; and drilling a via from the back surface of the support substrate.

The drilling is usually formed by dry etching, in order to obtain straight walls for the via and thus facilitate the uniform coating of the via with the insulating layer.

However, different materials must be etched (typically a first insulation layer, the wafer silicon bulk, and the layered semiconductor structure described above), so different methods and tools must be used in a predetermined sequence. The limitation of this method is linked to the difficulty of stopping the process at the right moment, i.e. to completely remove the required material without damaging the metal pad and to avoid the resputtering of its conductive material (usually, copper), i.e. ejection of conductive material towards the walls of the via, which can later induce short-circuits at the active device's junctions due to the diffusion of unwanted copper ions into the silicon bulk.

As a consequence, in spite of the aforementioned drawbacks, dry etching is still privileged over other known techniques since it is a simple and common way to rapidly obtain a straight via in an integrated circuit.

An insulating film is then coated on the via walls by conventional techniques such as deposition. These methods however also coat the conductive pad and the existing insulating layer(s), so that an additional step to remove the insulating film at least from the conductive pad becomes necessary, in order to enable connection with the components.

There is therefore a need for a method that overcomes the aforementioned drawbacks.

SUMMARY OF THE INVENTION

An objective of the invention is to provide a method for precisely forming a good through electrical connection in a layered semiconductor structure that avoids resputtering and guarantees the exposition of the device structure in a few steps.

To this end, the invention proposes a method for forming a vertical electrical connection in a layered semiconductor structure, comprising the following steps:

providing a layered semiconductor structure, said layered semiconductor structure comprising:

a support substrate including a first surface and a second surface (24), an insulating layer overlying the first surface of the support substrate, and at least one device structure formed in the insulating layer; and drilling a via from the second surface of the support substrate (20) up to the device structure, in order to expose the device structure;

characterized in that drilling of the insulating layer is at least partially performed by wet etching.

Some preferred but non limiting aspects of the invention are the following:

wet etching is performed during a predetermined time, said predetermined time depending on the material of the insulating layer, the etchant and the thickness of the insulating layer to be drilled;

wet etching is performed with a solution containing fluorhydric acid, and optionally glycerol;

the etchant comprises between 0.5% and 50% in volume of fluorhydric acid, preferably 1.35%;

the etchant further comprises between 0.5 and 50% in volume of glycerol, preferably 1.35%;

the method further comprises a pre-wetting step prior to the wet etching step (320), wherein the layered semiconductor structure is plunged in water;

a rinsing step following the wet etching step, wherein the layered semiconductor structure is rinsed with water;

the method further comprises a vacuum step following the wet etching step, wherein the layered semiconductor structure is submitted to a controlled vacuum;

the layered semiconductor structure is plunged in water during the vacuum step;

the method further comprises a removal step before the wet etching step, wherein the support substrate is thinned;

the method further comprises a pre-drilling step before the wet etching step, wherein a pre-via is formed from the second surface up to at least the insulating layer; and the pre-via is formed by dry etching, wet etching or reactive ion etching.

In accordance with a second aspect, the invention proposes a method for fabricating a vertical connection in a layered semiconductor structure, comprising the following steps:

forming the vertical connection in the layered semiconductor structure in accordance with the above-mentioned method, and wet coating the vertical connection with an insulating film by bringing a surface of said vertical connection into contact with a liquid solution.

Preferred but non limiting aspects of the method of the invention are the following:

the wet coating solution comprises:

a protic solvent;

at least one diazonium salt;

at least one monomer that is chain-polymerizable and soluble in said protic solvent;

at least one acid in a sufficient quantity to stabilize said diazonium salt by adjusting the pH of said solution to a value less than 7, preferably less than 2.5; and the surface of said vertical connection is polarizes according to a potentio- or galvano-pulsed mode for a duration sufficient to form a film having a thickness of at least 60 nanometers, and preferably between 80 and 500 nanometers;

the method further comprises the preparation of a copper diffusion barrier by:

a) forming by a wet process, at the surface of the insulating film, an organic film containing particles, especially nanoparticles, of metals or metal alloys, in particular of nickel or cobalt;

b) bringing the film thus formed into contact with a liquid solution containing at least one metal salt, preferably of the same nature as the metal incorporated into the organic film, a stabilizing agent, and at least one reducing agent under conditions enabling the formation of a metal film having a thickness of at least 100 nm;

the method further comprises the preparation (500) of a copper diffusion barrier by:

1. activating the surface of the insulating layer with a solution comprising:

i) an activator constituted of one or several palladium complexes chosen in the group consisting of:

palladium complexes having the formula (I):

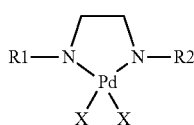

(I)

wherein:

R1 and R2 are identical and represent H; $CH_2CH_2NH_2$; $CH_2CH_2OH$; or

R1 represents H and R2 represents $CH_2CH_2NH_2$; or

R2 represents CH2CH2NHCH2CH2NH2 and R1 represents $CH_2CH_2NH_2$; or

R2 represents $CH_2CH_2NHCH_2CH_2NHCH_2CH_2NH_2$ and R1 represents H;

X represents a ligand chosen in the group consisting of Cl$^-$; Br$^-$; I$^-$; $H_2O$, $NO_3^-$; $CH_3SO_3^-$; $CF_3SO_3^-$; $CH_3$-Ph-$SO_3^-$; $CH_3COO^-$;

palladium complexes having the formula (IIa) or (IIb):

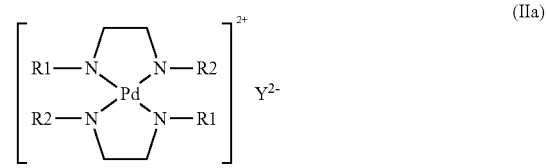

(IIa)

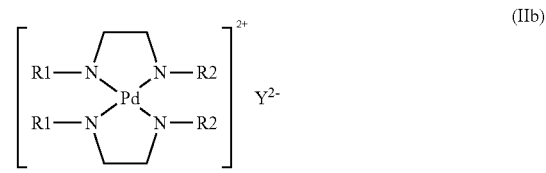

(IIb)

wherein:

R1 and R2 are defined as above-mentioned, and

Y represents a counter-ion comprising two negative charges constituted:

either of two mono-anions preferably chosen in the group consisting of Cl$^-$; $PF_6^-$; $BF_4^-$; $NO_3^-$; $CH_3SO_3^-$; $CF_3SO_3^-$; $CH_3C_6H_4SO_3^-$; $CH_3COO^-$; or of a di-anion, preferably $SO_4^{2-}$;

ii) an bi-functional organic binder constituted of one or several organosilanes having the general formula:

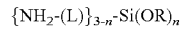  {NH$_2$-(L)}$_{3-n}$-Si(OR)$_n$   (V)

wherein:

L is a spacer selected from the group consisting of $CH_2$; $CH_2CH_2$; $CH_2CH_2CH_2$— and $CH_2CH_2NHCH_2CH_2$;

R is a group selected from the group consisting of $CH_3$, $CH_3CH_2$, $CH_3CH_2CH_2$, $(CH_3)_2CH$; and n is an integer equal to 1, 2 or 3.

iii) a solvent system constituted of one or several solvents suitable for solubilising said activator and said binder;

2. electrolessly depositing a metallic layer on the activated surface.

the method further comprises further comprising the preparation of a copper seed layer by:

a) bringing the free surface of the copper diffusion barrier layer into contact with a liquid solution comprising:

at least one solvent;

copper ions in a concentration of between approximately 14 and 120 mM;

ethylenediamine;

the molar ratio of ethylenediamine to copper being between 1.80 and 2.03;

the pH of said composition being between 6.6 and 7.5;

b) polarizing said free surface of the second layer for a sufficient duration to form said copper seed layer;

the method further comprises a step of metallization of the vertical electrical connection by electrodepositing copper with a composition comprising:

copper ions, said copper ions having a concentration of 45 to 1500 mM, preferably 45 to 500 mM, and more preferably 100 to 300 mM;

a complexing agent for copper, comprising at least one component of the group comprising the aliphatic polyamines having 2 to 4 amino groups, said complexing agent for copper having a concentration of 45 to 3000 mM, preferably 45 to 1500 mM, and more preferably 300 to 900 mM; The complexing agent for copper can be, for example, ethylenediamine, diethylenediamine, triethylenediamine or dipropylenetriamine, preferably ethylenediamine.

the molar ratio between copper and said complexing agent for copper being of 0.1 to 5, preferably 0.1 to 1, and more preferably 0.2 to 0.4;

thiodiglycolic acid, said thiodiglycolic acid having a concentration of 1 to 500 mg/L; and optionally, a buffering system, in particular ammonium sulphate, in a concentration of 0.1 to 3 M.

In accordance with a third aspect, the invention proposes a layered semiconductor structure comprising:

a support substrate including an first surface and a second surface, an insulating layer overlying the first surface of the support substrate, at least one device structure formed in the insulating layer; and at least one vertical connection, extending from the second surface of the support substrate up to the device structure, characterized in that the vertical connection comprises an undercut in the vicinity of the first surface of the support substrate obtainable in accordance with the aforementioned method.

Preferred but non-limiting aspects of the invention are the following:

the method further comprises at least an insulating film applied on the walls of the vertical connection in the vicinity of the support substrate (30), wherein said insulating layer has a uniform thickness and is obtained in particular by the aforementioned method;

the method further comprises a copper diffusion barrier over the insulating layer and the walls of the vertical connection, wherein said copper diffusion barrier has a uniform thickness and is obtained in particular by the aforementioned method;

the method further comprises a copper seed layer (80) over the copper diffusion barrier (70), wherein said copper seed layer (80) has a uniform thickness and is obtained in particular by the aforementioned method;

BRIEF DESCRIPTION OF THE DRAWINGS

Embodiments of the invention will now be described, by way of example, with reference to the accompanying drawings in which.

DETAILED DESCRIPTION OF A PREFERRED EMBODIMENT

Figure 1:
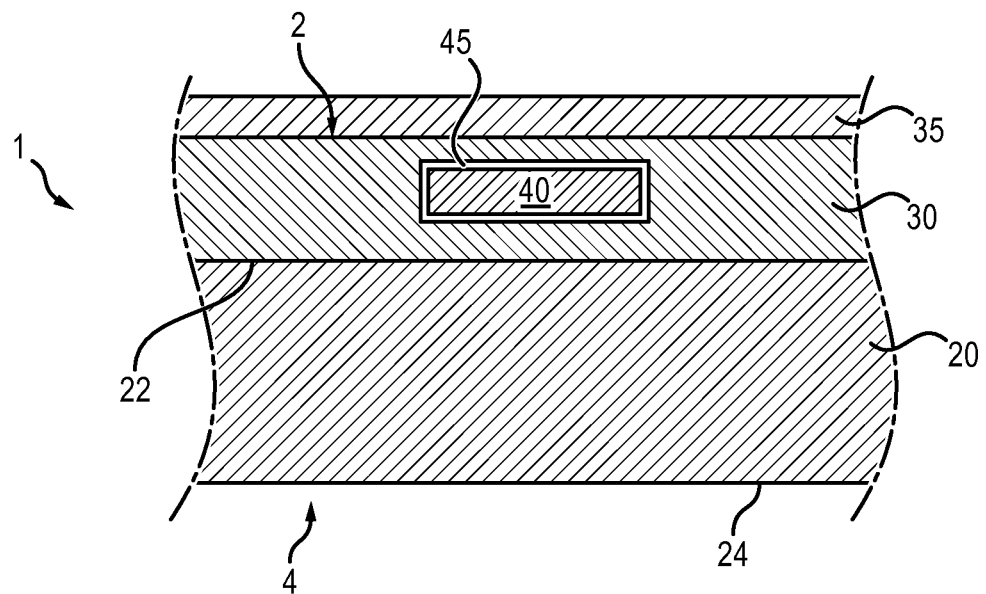
FIGS. 1 to 6 represent a sectional view of an example of semiconductor structure during the different steps of a method in accordance with the invention.

As used herein, the term "semiconductor structure" means any structure that is used in the formation of a semiconductor device. Semiconductor structures include, for example, dies and wafers (for example, carrier substrates and device substrates), as well as assemblies or composite structures that include two or more dies and/or wafers three-dimensionally integrated with one another. Semiconductor structures also include fully manufactured semiconductor devices, as well as intermediate structures formed during manufacture of semiconductor devices. A method for forming a vertical electrical connection in a layered semiconductor structure in accordance with the invention is illustrated in FIG. 1.

As used herein, the term "device structure" means and includes any portion of a processed semiconductor structure that constitutes, includes, or defines at least a portion of an active or passive component of a semiconductor device to be formed on or in the semiconductor structure. For example, device structures include active and passive components of integrated circuits such as, for example, transistors, transducers, capacitors, resistors, conductive lines, conductive vias, and conductive contact pads.

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

In one embodiment, as shown in FIG. 1, the present invention includes providing a semiconductor structure 1 having an active surface 2 and a back surface 4. The active surface 2 may be on a first side of the first semiconductor structure 1, with the back surface 4 on a second, opposite side.

The semiconductor structure 1 comprises:

a support substrate 20 including a first surface 22 and a second surface 24, an insulating layer 30 overlying the first surface of the support substrate, and at least one device structure 40 formed in the insulating layer.

The support substrate 20 may comprise, for example, one or more semiconductor materials such as Silicon (Si), Gallium (Ga), etc. and has a thickness of about 10 µm to about 750 µm. Here, the second surface 24 of the support substrate 20 corresponds to the back surface 4 of the semiconductor structure 1.

The insulating layer 30 has a thickness generally of about 1 µm to 20 µm, and can be made of Silicon Oxide ($SiO_2$), Silicon Oxycarbide (SiOC), hydrogenated Silicon Oxycarbide (SiOCH), Silicon Carbide (SiC), Silicon Nitride (SiN) or a mixture thereof.

Finally, the device structure 40 is here a conductive pad.

The conductive pad 40 is made of a conductive material such as Copper (Cu), Aluminum (Al), or an alloy comprising Aluminum and Copper.

The conductive pad 40 can further be coated with a barrier layer 45 of about 5 nm to 200 nm, in order to prevent diffusion of the conductive material. The barrier layer 45 can be made of titanium nitride (TiN), tantalum nitride (TaN), titanium or tantalum.

In the following, we will describe an embodiment of a method for forming a vertical electrical connection 50 in the semiconductor structure 1.

In a first step 100, a layered semiconductor structure 1 is provided.

Optionally, in a second step 200, the semiconductor structure 1 may be thinned by removing material from the second surface 24 of the support substrate 20. For example, the semiconductor structure 1 may be thinned using a chemical process (e.g., a wet or dry chemical etching process), a mechanical process (e.g., a grinding or lapping process), or by a chemical-mechanical polishing (CMP) process.

As a non-limiting example, the support substrate 20 can be thinned in order to reduce its thickness to about 50 µm.

Preferably, the active surface 2 of the semiconductor structure 1 is then bonded to a carrier 35 adapted to bring mechanical strength to the structure 1. Such a carrier 35 can be made of silicon oxide or silicon. An example of semiconductor structure 1 comprising such a carrier is shown in FIG. 1.

Figure 2:
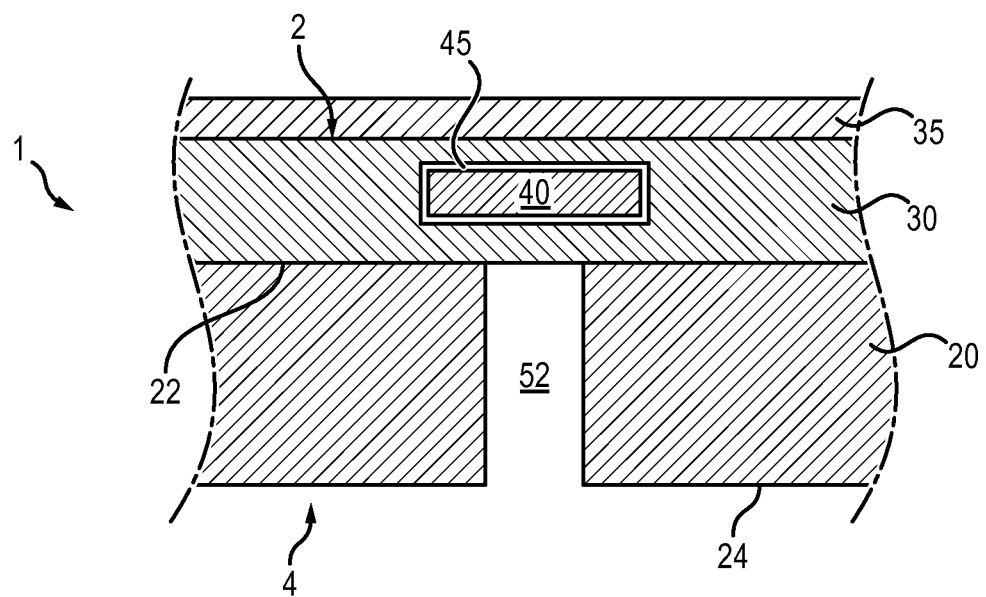

In a third step 300 (see FIGS. 2 to 3), the vias 50 are then formed in the semiconductor structure 1.

Formation of the vias 50 is performed by drilling a via from the second surface 24 of the support substrate 20 up to the conductive pad 40, in order to expose the conductive pad 40.

Figure 3:
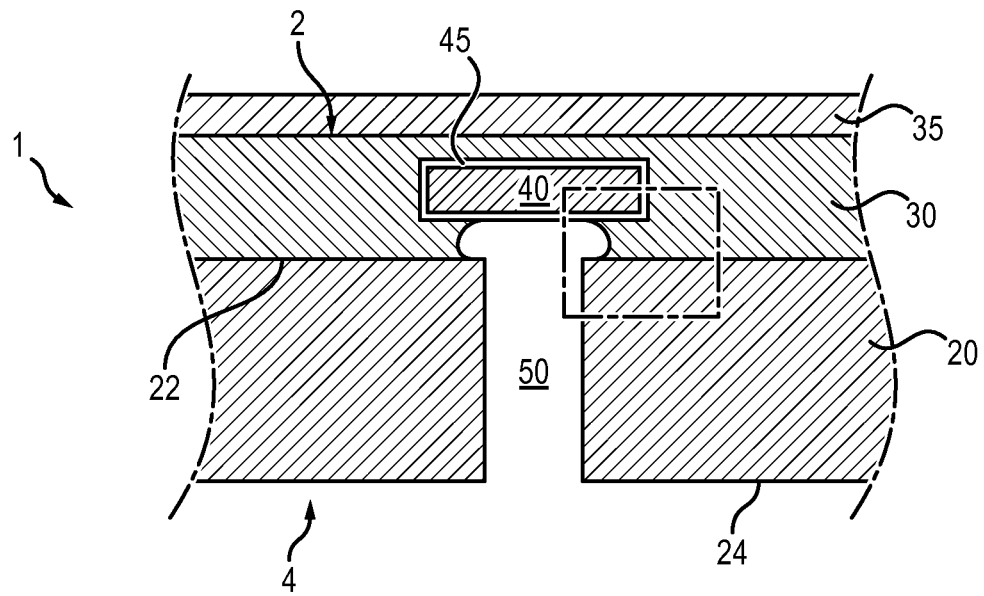

In accordance with the invention, drilling is performed by drilling first 310 the support substrate 20, in order to obtain a pre-via 52 which extends from the second surface 24 of the support substrate 20 to an area adjacent to the interface of the support substrate 20 with the insulating layer 30 (FIG. 2), and then by wet etching 320 the insulating layer 30 (FIG. 3).

Advantageously, forming a pre-via 52 in the support substrate 20 simplifies the wet etching step 320 if the etchant is chosen to be selective and does not react with the material of the support substrate 20. The use of a mask, which is conventional in wet etching whenever a specific shape is needed, is therefore pointless since in any case the etchant will only etch the insulating layer 30.

Drilling 300 of the pre-via 52 can be performed by any known technique such as dry etching, wet etching with an appropriate etchant, or reactive ion etching.

In accordance with a first embodiment, the pre-via extends from the back surface 4 to the first surface 22 of the support substrate.

Alternatively, the pre-via extends into the layer 30 up to an area adjacent to, but not in contact with, the barrier layer 45. In that case, the wet etching step 320 only drills the remaining thickness of insulating layer 30 in order to expose the barrier layer 45 of the conductive pad 40.

The etchant used during the wet etching step 320 of the insulating layer 30 can be fluorhydric acid, ammonium fluoride, a mixture thereof such as Buffered Oxide Etch (BOE) or any etchant adapted to selectively etch the material of the insulating layer 30 and not the material of the barrier layer 45 or the conductive material 40. For example, the etchant comprises between 0.1% and 50% by volume of fluorhydric acid, preferably between 0.1 and 2.5%, and the balance of deionized or distilled water. In this solution, polyols compounds suchs as glycerol, cathecol, ethyleneglycol or polyethyleneglycol, polypropylenalcohol, polyvinyl alcohol can be added to enhance the etch selectivity between the material of the insulating layer 30 and the material of the barrier layer 45. For example, the etchant comprises between 0.1 and 2.5% by volume of fluorhydric acid and between 0.1 and 2.5% by volume of glycerol and the balance of deionized or distilled water.

The wet etching step 320 is performed during a predetermined time which depends on the etchant, the material and the thickness of insulating material to be drilled.

For example, for an etchant comprising 1.75% of fluorhydric acid and an insulating layer made of $SiO_2$ CVD, the etching rate is about 120 nm/min.

More generally, the higher the concentration of fluorhydric acid in the etchant, the faster the etching rate.

The duration of the wet etching step 320 can therefore be precisely determined based on the thickness of $SiO_2$ to be etched so that via 50 be sufficiently deep in order to expose the barrier layer 45 of the conductive pad 40 without damaging said pad 40.

In addition, the choice of an etchant adapted to selectively etch the material of the insulating layer 30 and not the material of the barrier layer 45 of the conductive pad 40 further improves the accuracy of the process. In the aforementioned example, fluorhydric acid with added glycerol is selective since its etching rate of the barrier layer material is extremely slow by contrast with the etching rate of $SiO_2$. As a consequence, knowing the etching rate and the thickness of $SiO_2$ to be etched allows the exposition of the barrier layer 45 of the conductive pad 40 without damaging them, and without provoking resputtering of their constitutive materials. This effect can be strongly enhanced by using polyol compounds such as glycerol in the etchant. The polyol compounds will protect the barrier layer 45 from the fluorhydric acid. The selectivity can be thus increased by a factor of 200 based on the conventional etching rate.

Etchants such as fluorhydric acid being hydrophobic with Silicon, the method can further comprise a pre-wetting step 322, in order to improve the wet etching step 320. In that purpose, the semiconductor structure 1 is plunged into deionized or distilled water prior to the drilling of the vias 50 in the insulating layer 30, so that the etchant better diffuses inside the pre-vias 52.

Besides, at the end of the wet etching step 320, the semiconductor substrate can be rinsed (324) in deionized or distilled water, immersed (326) in fresh deionized or distilled water and then submitted 328 to vacuum, in order to stop the etching reaction and guarantee that the conductive pad 40 is not damaged and its material does not redeposit towards the walls of the via 50.

The vacuum step 328 can last for example from 1 to 10 minutes, under a vacuum of about 1 to 100 mbar.

EXAMPLE

Coupons (2*2 cm) of vias of 75×45 μm were first submitted to the pre-wetting step 322. They were then immediately immersed in an etchant comprising 1.35% by volume of fluorhydric acid (0.72 M) and 1.35% by volume of glycerol. Dilution of the etchant is chosen to have a good control in time of the etching. Indeed, when concentration of the etchant is too high, the barrier layer can also be attacked if the coupon is not extracted from the etchant at the right moment. Here, with a concentration of 1.35% by volume of fluorhydric acid, selectivity of the etchant remains good and limits the risk of etching the barrier layer.

Alternatively, glycerol can be further added to the fluorhydric acid in order to increase the etch selectivity between the oxide and the barrier layer. Indeed, an etchant comprising fluorhydric acid and glycerol will not etch the barrier layer, even if the coupon is left longer in the etchant (i.e during a period of time longer that the time necessary to drill the insulating layer 30 up to the pad).

At the desired time, the coupon is then rapidly rinsed (324) with deionized water, immersed (326) in fresh deionized water and subjected (328) to vacuum.

The resulting etch rate for the $SiO_2$ encountered in the bottom of the vias is about 40 nm/min.

For 800 nm of $SiO_2$ over the pad, we tested etching times of 16 min. and 18 min. The first etching time led the etching to around 80 nm over the pad and the second led the etching to exactly the top of the pad leading to the exposure of the latter.

At the end of the drilling step 300, the semiconductor substrate 1 comprises vias 50 extending from the active surface 2 to the barrier layer 45 (or the conductive pad 40, if the semiconductor substrate 1 does not comprise such a barrier layer 45).

Figure 3A:
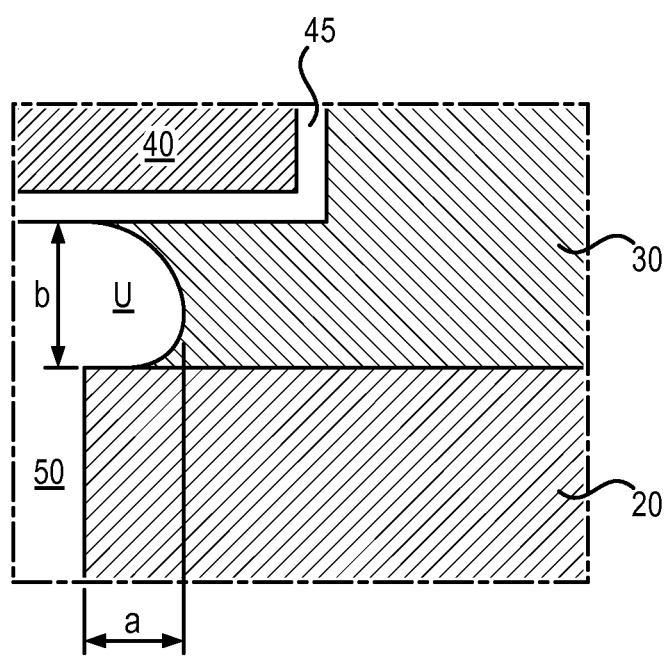
FIG. 3A is a close-up of one of the undercuts of FIG. 3.

Etching is however isotropic, so that the material of the insulating layer 30 is etched at a similar etching rate in every direction, thereby forming an undercut U in the area adjacent to the beginning of the wet etching step 320 (i.e. at the interface between the support substrate 20 and the insulating layer 30 when the pre-via extends up to the first surface 22 of the support substrate 20). An example of such an undercut is visible in FIGS. 3 and 3A.

For the above-mentioned via 50, the ratio between the transverse dimension a and the longitudinal dimension b of the undercut U is lying between 1 to 1.1.

Coating the walls of the via 50 in accordance with the conventional deposition methods is therefore difficult since they are not straight.

This is the reason why wet etching has never been considered as an option for drilling vias last. The unavoidable occurrence of the undercut U actually taught away the skilled person from realizing vias by wet etching.

The occurrence of the undercut U can however be compensated by performing a wet coating of the walls of the via 50.

Wet coating is a selective method which allows selectively coating the walls of the via 50 in the area of the support substrate 30.

Figure 5:
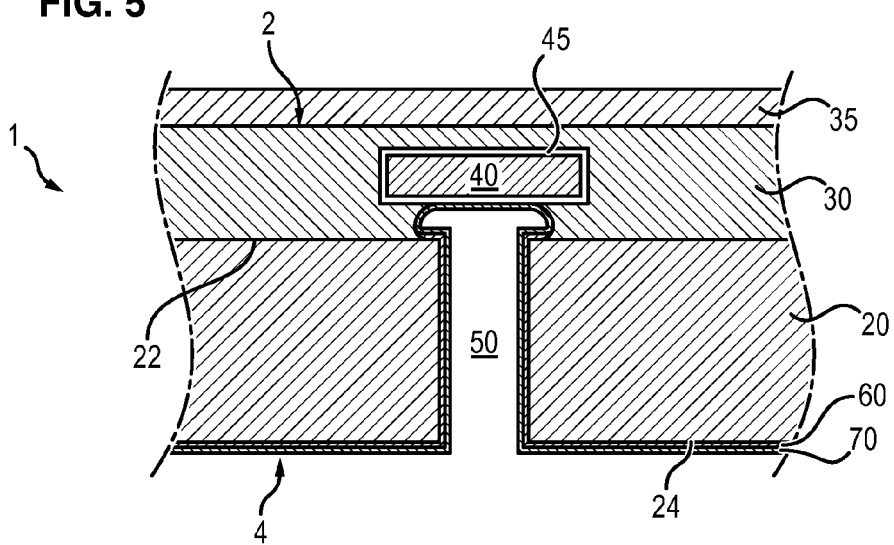
Figure 6:
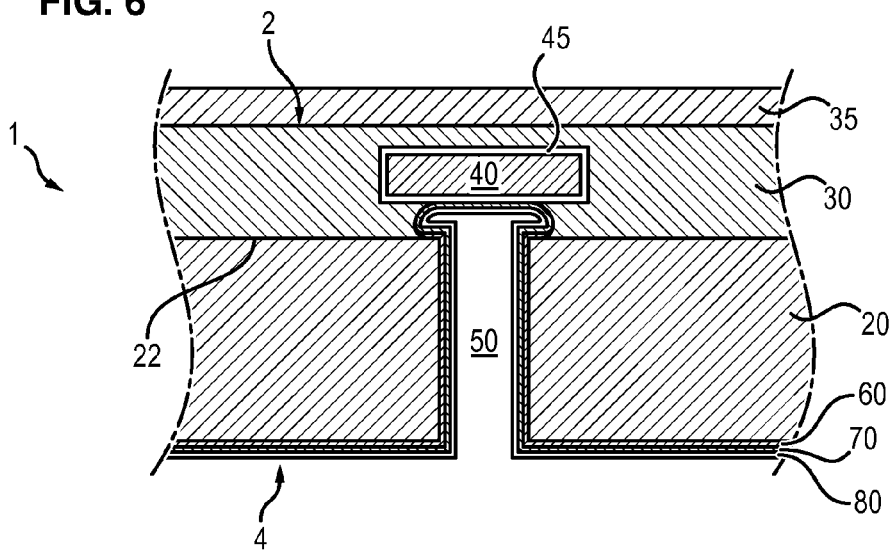
Figure 7:
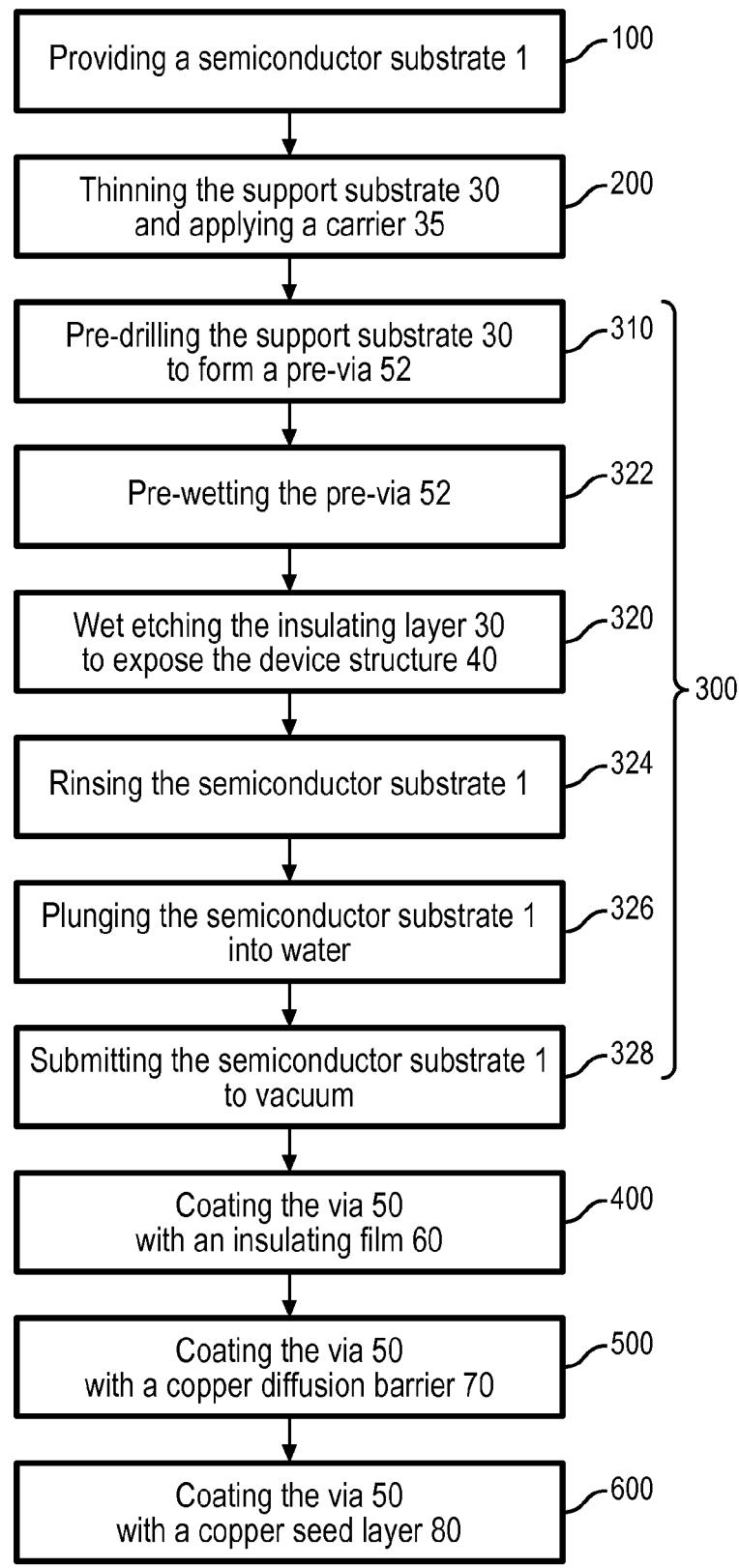
FIG. 7 is a flowchart of the steps of a method for forming a vertical electrical connection in the semiconductor structure of FIGS. 1 to 6 in accordance with an embodiment of the invention.

Advantageously, this method allows the coating of an insulating layer 60 (FIG. 4), a copper diffusion barrier 70 (FIG. 5) and a copper seed layer 80 (FIG. 6) of uniform thicknesses, whatever the shape of the walls wherein the coating has to be applied. In addition, by adequately choosing the solution used during the coating of the insulating film 60, the method can be selective and only coat the walls of the vias in the vicinity of the support substrate 30. By contrast, the layers 70 and 80 obtained by wet coating successively cover, with a uniform thickness, the whole surface of the via (50), i.e. the walls in the vicinity of the support layer 30 (already covered with the insulating film 60), the walls in the vicinity of the insulating layer 30, and the bottom of the via 50 (in the vicinity of the conductive pad 40).

Finally, this method is very efficient and allows the coating of several vias 50 at the same time.

An example of a wet coating method is known from document WO 2010/001054 in the name of the Applicant.

Figure 4:
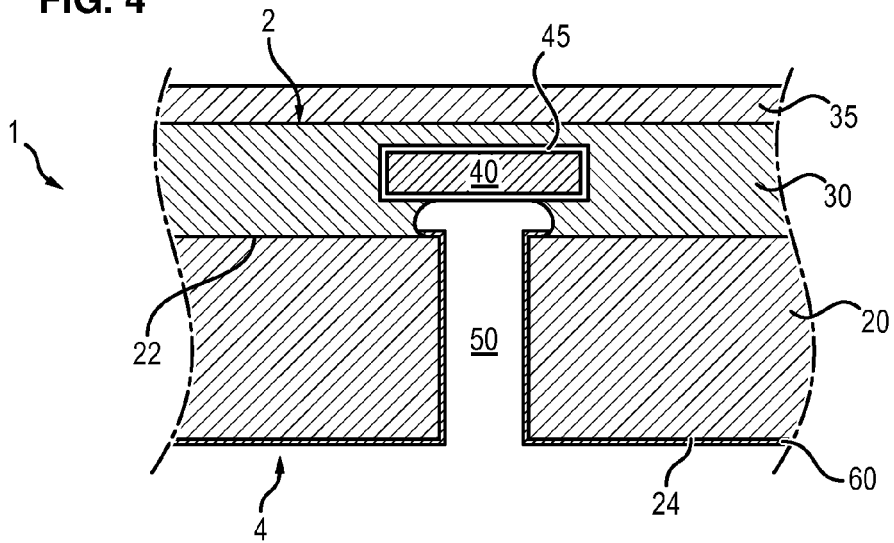

The method described in this document allows selective coating of the via 50 with an insulating film 60 (step 400—FIG. 4).

The semiconductor substrate 1 which is obtained in accordance with this method thus comprises vias 50 uniformly coated with the insulating film 60 in the vicinity of the support substrate 20 only and not on the insulating layer 30 nor on the conductive pad 40 (or its barrier layer 45), without necessitating any additional steps of removal of the insulating film deposited on the conductive pad 40 or the insulating layer 30.

The method described in WO 2010/001054 also allows the preparation of a copper diffusion barrier 70 (step 500—FIG. 5), optionally of a copper seed layer 80 (step 600—FIG. 6) and its metallization by filling with copper, in spite of the undercut U.

More precisely, WO 2010/001054 describes the preparation (step 400) of an electrically insulating film 60 at the surface of an electrical conductor or semiconductor substrate, such as the support substrate 20, comprising:

a) bringing said surface into contact with a liquid solution comprising:
 a protic solvent;
 at least one diazonium salt;
 at least one monomer that is chain-polymerizable and soluble in said protic solvent;
 at least one acid in a sufficient quantity to stabilize said diazonium salt by adjusting the pH of said solution to a value less than 7, preferably less than 2.5;

b) the polarization of said surface according to a potentio- or galvano-pulsed mode for a duration sufficient to form a film having a thickness of at least 80 nanometers, and preferably between 100 and 500 nanometers.

The protic solvent used can be chosen from the group consisting of water, preferably deionized or distilled water, and hydroxylated solvents, in particular alcohols having 1 to 4 carbon atoms; carboxylic acids having 2 to 4 carbon atoms, in particular formic acid and acetic acid, and mixtures thereof.

Water constitutes the protic solvent currently preferred in the context of the invention.

Generally speaking, many diazonium salts are capable of being used for the implementation of the method according to this first aspect of the invention, and in particular the diazonium salts mentioned in document WO 2007/099218.

Thus, according to a particular characteristic, the diazonium salt is an aryldiazonium salt chosen from the compounds of the following formula (I):

$$R\text{—}N_2^+, A^- \qquad (I)$$

in which:

A represents a monovalent anion,

R represents an aryl group.

As an example of an aryl group R, it is possible in particular to mention the unsubstituted, mono- or polysubstituted aromatic or heteroaromatic carbon structures, consisting of one or more aromatic or heteroaromatic rings, each comprising 3 to 8 atoms, the heteroatom(s) being chosen from N, O, S, or P; the optional substituent(s) preferably being chosen from electron-attracting groups such as $NO_2$, CHO, ketones, CN, $CO_2H$, $NH_2$, esters and the halogens.

The use of an electrografting protocol in pulsed mode constitutes another aspect of the method, to the extent that this particular protocol makes it possible, completely unexpectedly and in contrast to a cyclic voltammetry electrografting protocol, to obtain a continuous and uniform film with a growth kinetics compatible with industrial constraints.

The method of preparing an electrically insulating film 60 which has just been described is especially useful in the preparation of through-silicon vias 50, in particular of 3D integrated circuits, for constituting the internal electrically insulating layer designed to be coated with the barrier layer 70 serving to prevent copper migration or diffusion (step 500).

Advantageously, the aforementioned barrier layer 70 is itself produced by a wet deposition method, preferably in a liquid medium of protic nature for reasons that will straightforwardly be understood.

For such purpose, WO 2010/001054 discloses (step 500) a method of preparing a coating of the semiconductor substrate, said coating consisting of a first layer forming the electrically insulating film 60 and a second layer forming the copper diffusion barrier 70, wherein the second layer is produced by:

a) the formation by wet process, at the surface of the first layer thus obtained, of an organic film containing particles, especially nanoparticles, of metals or metal alloys, in particular of nickel or cobalt;

b) bringing the film 60 thus formed into contact with a liquid solution containing at least one metal salt, preferably of the same nature as the metal incorporated into the organic film, and at least one reducing agent under conditions enabling the formation of a metal film having a thickness of at least 20 nm.

Step a) is carried out by bringing the free surface of the aforementioned internal layer into contact with a liquid solution containing:

at least one solvent, preferably a protic solvent;
at least one diazonium salt;
at least one monomer that is chain-polymerizable and soluble in said solvent; and
at least one chemical initiator enabling the formation of radical entities from said diazonium salt.

The protic solvent and the diazonium salt employed in step a) may be of the same nature as the protic solvent used for the internal layer.

The use of an aprotic solvent, such as dimethylformamide, acetone or dimethyl sulphoxide, is nonetheless conceivable in the scope of implementing step. a).

The monomer that can be chain-polymerized by free radical methods may vary in nature.

It will especially be chosen from the monomers described in WO 2007/099218.

Alternatively, the barrier layer 70 can also be produced in accordance with the following steps:

1. Activating the surface of the insulating layer with a solution comprising:
i) an activator constituted of one or several palladium complexes chosen in the group consisting of:
palladium complexes having the formula (I):

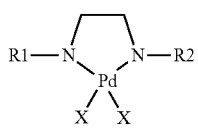

wherein:
R1 and R2 are identical and represent H; $CH_2CH_2NH_2$; $CH_2CH_2OH$; or
R1 represents H and R2 represents $CH_2CH_2NH_2$; or
R2 represents CH2CH2NHCH2CH2NH2 and R1 represents $CH_2CH_2NH_2$; or
R2 represents $CH_2CH_2NHCH_2CH_2NHCH_2CH_2NH_2$ and R1 represents H;
X represents a ligand chosen in the group consisting of Cl$^-$; Br$^-$; I$^-$; $H_2O$, $NO_3^-$; $CH_3SO_3^-$; $CF_3SO_3^-$; $CH_3$-Ph-$SO_3^-$; $CH_3COO^-$;
palladium complexes having the formula (IIa) or (IIb):

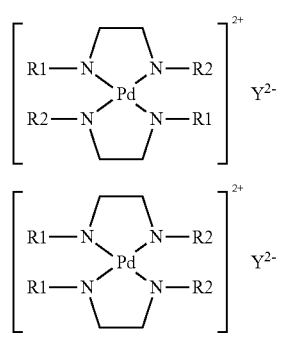

wherein:
R1 and R2 are defined as above-mentioned, and
Y represents a counter-ion comprising two negative charges constituted:

either of two mono-anions preferably chosen in the group consisting of Cl$^-$; $PF_6^-$; $BF_4^-$; $NO_3^-$; $CH_3SO_3^-$; $CF_3SO_3^-$; $CH_3C_6H_4SO_3^-$; $CH_3COO^-$; or
of a di-anion, preferably $SO_4^{2-}$;
ii) a bi-functional organic binder constituted of one or several organosilanes having the general formula:
iii)

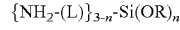

$$\{NH_2\text{-}(L)\}_{3-n}\text{-}Si(OR)_n \qquad (V)$$

wherein:
L is a spacer selected from the group consisting of $CH_2$; $CH_2CH_2$; $CH_2CH_2CH_2$— and $CH_2CH_2NHCH_2CH_2$;
R is a group selected from the group consisting of $CH_3$, $CH_3CH_2$, $CH_3CH_2CH_2$, $(CH_3)_2CH$; and
n is an integer equal to 1, 2 or 3.
iv) a solvent system constituted of one or several solvents suitable for solubilising said activator and said binder.

2. Electrolessly depositing a metallic layer on the activated surface.

In accordance with an embodiment, the solution comprises water in an amount inferior or equal to 0.5%, preferably 0.2%, and more preferably 0.1% in volume.

The activator has a concentration of $10^{-6}$ M and $10^{-2}$ M, preferably between $10^{-5}$ M and $10^{-3}$ M, still more preferably between $5\times10^{-5}$ M and $5\times10^{-4}$ M, and the binder has a concentration comprised between $10^{-5}$ M and $10^{-1}$ M, preferably between $10^{-4}$ M and $10^{-2}$ M, still more preferably between $5\times10^{-4}$ M and $5\times10^{-3}$ M.

The bifunctional organic binder preferably consists of one or more organosilane compounds having the formula (V), wherein:
L is $CH_2CH_2CH_2$— and R is $CH_3$ (APTMS);
or L is $CH_2CH_2CH_2$— and R is $CH_3$ (APTES);
or L is $CH_2CH_2NHCH_2CH_2$ and R is $CH_3$ (DATMS or DAMO).

The solvent system can consist of one or more solvents selected from the group consisting of N-methylpyrrolidinone (NMP), dimethylsulphoxide (DMSO), alcohols, ethyleneglycol ethers such as for example monoethyl-diethyleneglycol, propyleneglycol ethers, dioxane and toluene.

Finally, the activator can consist of one or more palladium complexes selected from the group consisting of:
complexes having the formula (I), wherein:
R1 is H, R2 is $CH_2CH_2NH_2$ and X is Cl, a complex named (diethylenetriamine)(dichloro) palladate (II);
R1 and R2 are identical and are $CH_2CH_2OH$ and X is Cl, a complex named (N,N'-bis(2-hydroxyethyl)ethylenediamine)-(dichloro)palladate (II);
complexes having the formula (IIa) wherein:
R1 is H, R2 is $CH_2CH_2NH_2$ and Y is two Cl, a complex named trans-bis(diethylenetriamine) palladate (II);
complexes having the formula (IIb) wherein:
R1 is H, R2 is $CH_2CH_2NH_2$ and Y is two Cl, a complex named cis-bis(diethylenetriamine)palladate (II);
at a concentration comprised between $5\times10^{-5}$ M and $5\times10^{-4}$ M.

For more information, one can refer to the description of the patent application FR 2 950 634.

The method of preparing a bilayer coating (insulator/barrier layer) that has just been described is especially useful in the preparation of through-vias 50, especially of integrated circuits, for constituting the internal structure, which can optionally be coated with a copper seed layer 80 enabling the metallization of the through-vias.

The aforementioned copper seed layer 80 can also be produced by a wet deposition method, preferably in a liquid medium.

For such purpose, WO 2010/001054 discloses a method (step 600) of preparing a coating of the semiconductor substrate, said coating consisting of an internal first layer forming the electrically insulating film 60, an intermediate second layer forming the copper diffusion barrier 70, and a third, external copper seed layer 80, which layer is produced by bringing the free surface of the second layer into contact with a liquid solution comprising:

at least one solvent;
copper ions in a concentration of between 14 and 120 mM;
ethylenediamine;
the molar ratio of ethylenediamine to copper being between 1.80 and 2.03;
the pH of said composition being between 6.6 and 7.5;
b) polarization of said free surface of the second layer for a sufficient duration to form said third layer.

As will be understood, this step makes it possible to carry out metallization of the vias 50.

The liquid solutions employed in this step make it possible to obtain a copper seed layer 80 leading to a particularly high coverage rate (greater than 99%) of the substrate including in the most critical areas of the vias, and this even when the structure has a high form factor (aspect ratio greater than 3:1, or even of the order of 10 to 15:1) and a relatively high via volume (from $0.8 \times 10^1$ to $5 \times 10^6$ μm³). These liquid solutions are therefore perfectly compatible with a use at the industrial scale.

One preferred family of liquid solutions employed in step C. comprises those whose copper ions are present in a concentration of between 16 and 64 mM.

Another preferred family of liquid solutions comprises those whose molar ratio of copper ions to ethylenediamine is between 1.96 and 2.00.

The through-via can then be metallized by filling with copper in accordance with the usual methods.

Alternatively, metallization of the through-via is performed without coating the barrier layer 70 with a seed layer 80, by direct filling of the via (coated with the insulating layer 60 and the barrier layer 60 only) in accordance with the description of the French patent application no. FR 10 54668.

In that purpose, metallization of the via is obtained by electrodepositing copper with a composition comprising:

copper ions, said copper ions having a concentration of 45 to 1500 mM, preferably 45 to 500 mM, and more preferably 100 to 300 mM;
a complexing agent for copper, comprising at least one component of the group comprising the aliphatic polyamines having 2 to 4 amino groups, said complexing agent for copper having a concentration of 45 to 3000 mM, preferably 45 to 1500 mM, and more preferably 300 to 900 mM;
The complexing agent for copper can be, for example, ethylenediamine, diethylenediamine, triethylenediamine or dipropylenetriamine, preferably ethylenediamine.
the molar ratio between copper and said complexing agent for copper being of 0.1 to 5, preferably 0.1 to 1, and more preferably 0.2 to 0.4;
thiodiglycolic acid, said thiodiglycolic acid having a concentration of 1 to 500 mg/L; and
optionally, a buffering system, in particular ammonium sulphate, in a concentration of 0.1 to 3 M.

In accordance with an embodiment, the solvent is water, and the copper ions come from copper (II) sulfate.

EXAMPLE

After the wet etching step, the resulting substrate (coupon of 4×4 cm in size) is washed in deionised water in an ultrasonic bath (320 W, 35 KHz), treated with a modified piranha solution (60 ml $H_2O_2$+15 mL pure sulphuric acid+1 ml of a 100 ppm HF solution) for 3 minutes also in an ultrasonic bath (320 W, 35 KHz). The use of Teflon vessels or equivalent is required. The coupon is finally prewetted with deionised water and submitted to electrografting of P4VP.

The electrografting solution employed in this example is an aqueous solution prepared by introducing 5 mL of 4-vinylpyridine (4-VP; $4.5 \times 10^{-2}$ mol) into 95 ml of HCl 1M, then adding to the mixture 236 mg of commercially available 4-nitrobenzenediazonium tetrafluoroborate ($DNO_2$; $1 \times 10^{-3}$ mol).

The methods that have just been described make it possible to fabricate wafers of conductor or semiconductor material, especially made of silicon, with a novel structure.

Protocol

To carry out electrografting on the silicon substrate a system has been used which is composed of:

a sample holder equipped with means for rotating at a predetermined speed and shaped to support the substrate, the assembly thus constituted being intended to serve as the working electrode;
a carbon sheet intended to serve as the counter-electrode;
a stabilized electrical power supply and electrical connection device.

The electrografting of the P4VP onto the surface of the silicon substrate has been carried out by applying to the substrate, previously caused to rotate at a speed of 40 to 100 rpm (60 rpm in the example), a "pulsed voltage" electrochemical protocol for a predetermined duration of around 10 to 30 minutes (15 minutes in the example).

a total period P of between 0.01 and 2 seconds (0.6 seconds in the example);
a polarization time T on of between 0.01 and 1 s (0.36 seconds in the example) during which a potential difference of 5 V to 20 V is applied to the surface of the substrate (cathode potential of −17 V in the example); and
an idle period with zero potential, called T off, of a duration of between 0.01 and 1 s (0.24 seconds in the example).

The duration of this electrografting step depends, as will be understood, on the desired thickness of the polymer insulating layer 60.

Once the electrografting is finished, the sample is washed several times, first with water, then with dimethylformamide (DMF), and finally once again with deionised water. The drying of the sample is carried out in an inert atmosphere typically at 250° C. during 10 minutes.

The carrier 35 is then withdrawn from the semiconductor structure 1.

The invention claimed is:

1. A method for forming a vertical electrical connection in a layered semiconductor structure, comprising the following steps:
   providing a layered semiconductor structure, said layered semiconductor structure comprising:
      a support substrate including a first surface and a second surface,
      an insulating layer overlying the first surface of the support substrate, and
      at least one device structure formed in the insulating layer; and
   drilling a via from the second surface of the support substrate up to the device structure, in order to expose the device structure, drilling of the insulating layer being at least partially performed by wet etching;
   wet coating the via with an insulating film by bringing a surface of said via into contact with a liquid solution, in order to obtain a uniform insulating film, wherein the wet coating of the via is selective and only coats the via in the vicinity of the support substrate and preparing a copper diffusion barrier by forming by a wet process, at the surface of the insulating film, an organic film containing particles of metals or metal alloys.

2. The method of claim 1, wherein wet etching is performed during a predetermined time, said predetermined time depending on the material of the insulating layer, the etchant and the thickness of the insulating layer to be drilled.

3. The method of claim 1 or 2, wherein wet etching is performed with a solution containing fluorhydric acid, and optionally glycerol.

4. The method of claim 3, wherein the etchant comprises between 0.5% and 50% in volume of Fluorhydric acid, preferably 1.35%.

5. The method of claim 3 or 4, wherein the etchant further comprises between 0.5 and 50% in volume of glycerol, preferably 1.35%.

6. The method of anyone of claims 1 to 5 further comprising a pre-wetting step prior to the wet etching step, wherein the layered semiconductor structure is plunged in water.

7. The method of anyone of claims 1 to 6 further comprising a rinsing step following the wet etching step, wherein the layered semiconductor structure is rinsed with water.

8. The method of anyone of claims 1 to 7 further comprising a vacuum step following the wet etching step, wherein the layered semiconductor structure is submitted to a controlled vacuum.

9. The method of claim 8, wherein the layered semiconductor structure is plunged in water during the vacuum step.

10. The method of anyone of claims 1 to 9 further comprising a removal step before the wet etching step, wherein the support substrate is thinned.

11. The method of anyone of claims 1 to 10 further comprising a pre-drilling step before the wet etching step, wherein a pre via is formed from the second surface up to at least the insulating layer.

12. The method of claim 11, wherein the pre via is formed by dry etching, wet etching or reactive ion etching.

13. The method of claim 1, wherein the solution comprises:
a protic solvent;
at least one diazonium salt;
at least one monomer that is chain-polymerizable and soluble in said protic solvent;
at least one acid in a sufficient quantity to stabilize said diazonium salt by adjusting the pH of said solution to a value less than 7, preferably less than 2.5; and
wherein the surface of said vertical connection is polarizes according to a potentio- or galvano-pulsed mode for a duration sufficient to form a film having a thickness of at least 60 nanometers, and preferably between 80 and 500 nanometers.

14. The method of claim 1, wherein the particles of metal or metal alloys of the organic film may comprise nanoparticles wherein the metal or metal alloy may comprise and the step of preparation of the copper diffusion barrier further comprises, nickel or cobalt;
bringing the film thus formed into contact with a liquid solution containing at least one metal salt, preferably of the same nature as the metal incorporated into the organic film, a stabilizing agent, and at least one reducing agent under conditions enabling the formation of a metal film having a thickness of at least 100 nm.

15. The method of claim 1, further comprising the preparation of a copper diffusion barrier by:

1. activating the surface of the insulating layer with a solution comprising:
i) an activator constituted of one or several palladium complexes chosen in the group consisting of:
palladium complexes having the formula:

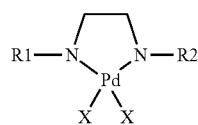

wherein:
R1 and R2 are identical and represent H; $CH_2CH_2NH_2$; $CH_2CH_2OH$; or
R1 represents H and R2 represents $CH_2CH_2NH_2$; or
R2 represents CH2CH2NHCH2CH2NH2 and R1 represents $CH_2CH_2NH_2$; or
R2 represents $CH_2CH_2NHCH_2CH_2NHCH_2CH_2NH_2$ and $R_1$ represents H;
X represents a ligand chosen in the group consisting of $Cl^-$; $Br^-$; $I^-$; $H_2O$, $NO_3^-$; $CH_3SO_3^-$; $CF_3SO_3^-$; $CH_3$-Ph-$SO_3^-$; $CH_3COO^-$;
palladium complexes having the formula or:

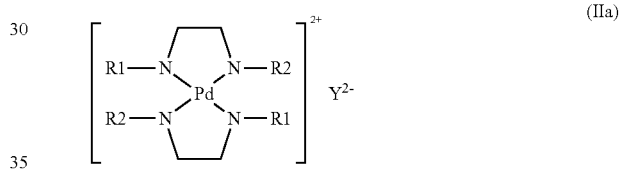

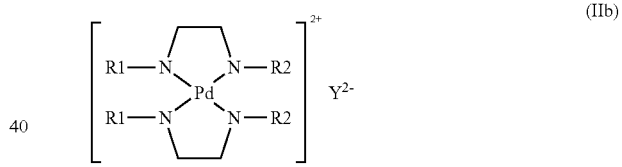

wherein:
R1 and R2 are defined as above-mentioned, and
Y represents a counter-ion comprising two negative charges constituted:
either of two mono-anions preferably chosen in the group consisting of $Cl^-$; $PF_6^-$; $BF_4^-$; $NO_3^-$; $CH_3SO_3^-$; $CF_3SO_3^-$; $CH_3C_6H_4SO_3$; $CH_3COO^-$; or
of a di-anion, preferably $SO_4^{2-}$;
ii) an bi-functional organic binder constituted of one or several organosilanes having the general formula:

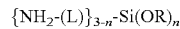

wherein:
L is a spacer selected from the group consisting of $CH_2$; $CH_2CH_2$; $CH_2CH_2CH_2$— and $CH_2CH_2NHCH_2CH_2$;
R is a group selected from the group consisting of $CH_3$, $CH_3CH_2$, $CH_3CH_2CH_2$, $_2CH$; and
n is an integer equal to 1, 2 or 3,
iii) a solvent system constituted of one or several solvents suitable for solubilising said activator and said binder;
2. electrolessly depositing a metallic layer on the activated surface.

16. The method of claim 14 or 15, further comprising the preparation of a copper seed layer by:

a) bringing the free surface of the copper diffusion barrier layer into contact with a liquid solution comprising:
   at least one solvent;
   copper ions in a concentration of between approximately 14 and 120 mM;
   ethylenediamine;
   the molar ratio of ethylenediamine to copper being between 1.80 and 2.03;
   the pH of said composition being between 6.6 and 7.5;
b) polarizing said free surface of the second layer for a sufficient duration to form said copper seed layer.

17. The method of claim 16, further comprising a step of metallization of the vertical electrical connection by electrodepositing copper with a composition comprising:
   copper ions, said copper ions having a concentration of 45 to 1500 mM, preferably 45 to 500 mM, and more preferably 100 to 300 mM;
   a complexing agent for copper, comprising at least one component of the group comprising the aliphatic polyamines having 2 to 4 amino groups, said complexing agent for copper having a concentration of 45 to 3000 mM, preferably 45 to 1500 mM, and more preferably 300 to 900 mM;
   the molar ratio between copper and said complexing agent for copper being of 0.1 to 5, preferably 0.1 to 1, and more preferably 0.2 to 0.4;
   thiodiglycolic acid, said thiodiglycolic acid having a concentration of 1 to 500 mg/L; and
   optionally, a buffering system, in particular ammonium sulphate, in a concentration of 0.1 to 3 M.

18. A method for forming a vertical electrical connection in a layered semiconductor structure, comprising the following steps:
   providing a layered semiconductor structure, said layered semiconductor structure comprising:
   a support substrate including a first surface and a second surface,
   an insulating layer overlying the first surface of the support substrate, and
   at least one device structure formed in the insulating layer; and
   drilling a via from the second surface of the support substrate up to the device structure, in order to expose the device structure, drilling of the insulating layer being at least partially performed by wet etching;
   wet coating the via with an insulating film by bringing a surface of said via into contact with a liquid solution, in order to obtain a uniform insulating film, wherein the wet coating of the via is selective and only coats the via in the vicinity of the support substrate,
   wherein the solution comprises:
   a protic solvent;
   at least one diazonium salt;
   at least one monomer that is chain-polymerizable and soluble in said protic solvent; and
   at least one acid in a sufficient quantity to stabilize said diazonium salt by adjusting the pH of said solution to a value less than 7, preferably less than 2.5.

19. The method of claim 18, wherein the surface of said vertical connection is polarized according to a potentio- or galvano-pulsed mode for a duration sufficient to form a film having a thickness of at least 60 nanometers, and preferably between 80 and 500 nanometers.

20. A method for forming a vertical electrical connection in a layered semiconductor structure, comprising the following steps:

providing a layered semiconductor structure, said layered semiconductor structure comprising:
   a support substrate including a first surface and a second surface
   an insulating layer overlying the first surface of the support substrate, and
   at least one device structure formed in the insulating layer; and
   drilling a via from the second surface of the support substrate up to the device structure, in order to expose the device structure, drilling of the insulating layer being at least partially performed by wet etching;
   wet coating the via with an insulating film by bringing a surface of said via into contact with a liquid solution, in order to obtain a uniform insulating film, wherein the wet coating of the via is selective and only coats the via in the vicinity of the support substrate, and
   preparing a copper diffusion barrier by activating the surface of the insulating layer with a solution comprising:
i) an activator constituted of one or several palladium complexes,
ii) an bi-functional organic binder,
iii) a solvent system constituted of one or several solvents suitable for solubilizing said activator and said binder.

21. The method of claim 20, wherein:
   i) the one or several palladium complexes are chosen in the group consisting of:
   palladium complexes having the formula:
   R1 N N R2
   Pd
   X X (I)
   wherein:
   R1 and R2 are identical and represent H; CH2CH2NH2; CH2CH2OH; or
   R1 represents H and R2 represents CH2CH2NH2; or
   R2 represents CH2CH2NHCH2CH2NH2 and R1 represents CH2CH2NH2; or
   R2 represents CH2CH2NHCH2CH2NHCH2CH2NH2 and R1 represents H;
   X represents a ligand chosen in the group consisting of Cl—; Br—; I—; H2O, NO3-; CH3SO3-; CF3SO3-; CH3-Ph-SO3-; CH3COO—;
palladium complexes having the formula or:
Y2-
Y2-
R1 N N R2
R1 N N R2
Pd
R2 N N R1
R1 N N R2
Pd
(IIa) (IIb)
2+
wherein:
   R1 and R2 are defined as above-mentioned, and
   Y represents a counter-ion comprising two negative charges constituted:
   either of two mono-anions preferably chosen in the group consisting of Cl—; PF6-; BF4-; NO3-; CH3SO3-; CF3SO3-; CH3C6H4SO3-; CH3COO—; or
   of a di-anion, preferably $SO_4^{2-}$;

ii) the bi-functional organic binder is constituted of one or several organosilanes having the general formula:

{NH2-(L)}3-$n$-Si(OR)$n$ wherein:
L is a spacer selected from the group consisting of CH2; CH2CH2; CH2CH2CH2- and CH2CH2NHCH2CH2;
R is a group selected from the group consisting of CH3, CH3CH2, CH3CH2CH2, 2CH; and
$n$ is an integer equal to 1, 2 or 3, and the step of preparation of the copper diffusion barrier further comprises electrolessly depositing a metallic layer on the activated surface.

\* \* \* \* \*